US006709557B1

(12) United States Patent
Kailasam et al.

(10) Patent No.: US 6,709,557 B1
(45) Date of Patent: Mar. 23, 2004

(54) SPUTTER APPARATUS FOR PRODUCING MULTI-COMPONENT METAL ALLOY FILMS AND METHOD FOR MAKING THE SAME

(75) Inventors: Sridhar K. Kailasam, Fremont, CA (US); Ronald A. Powell, San Carlos, CA (US); E. Derryck Settles, Franklin, MA (US)

(73) Assignee: Novellus Systems, Inc., San Jose, CA (US)

(*) Notice: Subject to any disclaimer, the term of this patent is extended or adjusted under 35 U.S.C. 154(b) by 0 days.

(21) Appl. No.: 10/085,361

(22) Filed: Feb. 28, 2002

(51) Int. Cl.[7] ............................................. C23C 14/35
(52) U.S. Cl. ............................ 204/298.13; 204/298.12
(58) Field of Search ............................ 204/298.12, 298.13

(56) References Cited

U.S. PATENT DOCUMENTS

| | | | |
|---|---|---|---|
| 4,468,313 A | * 8/1984 | Okumura et al. | 204/298.12 |
| 5,190,630 A | * 3/1993 | Kikuchi et al. | 204/192.12 |
| 5,512,156 A | 4/1996 | Yamanishi et al. | 204/298.16 |
| 6,001,718 A | * 12/1999 | Katata et al. | 438/592 |
| 6,093,293 A | 7/2000 | Haag et al. | 204/298.12 |
| 6,193,854 B1 | 2/2001 | Lai et al. | 204/192.12 |
| 6,206,985 B1 | 3/2001 | Onishi et al. | 148/437 |
| 6,235,170 B1 | 5/2001 | Glocker | 204/298.18 |
| 6,283,357 B1 | 9/2001 | Kulkarni et al. | 228/155 |
| 6,309,516 B1 | 10/2001 | McLeod | 204/192.2 |
| 6,312,574 B1 | 11/2001 | Quaderer et al. | 204/298.17 |
| 6,488,822 B1 | * 12/2002 | Moslehi | 204/192.12 |

* cited by examiner

Primary Examiner—Steven H. VerSteeg
(74) Attorney, Agent, or Firm—DeLio & Peterson, LLC; Robert Curcio

(57) ABSTRACT

A mosaic or inlaid sputter target design suitable for conventional planar magnetron deposition, RF ionized physical vapor deposition, HCM ionized PVD, ionized metal plasma (IMP) deposition, or self-ionized plasma (SIP) deposition of multi-component alloys for use in integrated circuit metallization. Inlays are inserted within a planar sputter target in the shape of wedges, wires, or buttons to achieve uniform deposition of films on semiconductor substrates during sputtering. Metal alloy strips within a three-dimensional HCM target achieve the same uniform deposition. The deposition leads to the production of CuAl, CuBe, CuB, CuCd, CuCo, CuCr, CuIn, CuPd, CuSn, CuTa, CuTi, CuZr or CuZn alloy films deposited on the wafer. Non-copper films may also be deposited. The inlay-target adjoining surfaces may be machine stepped or tapered to limit wicking from the target backing material.

41 Claims, 12 Drawing Sheets

Contoured Wedge-shaped Inlays
(Areal Density Increases With Radius)

Uniform Wedge-shaped Inlays
(Areal Density Constant With Radius)

Contoured Wedge-shaped Inlays
(Areal Density Increases With Radius)

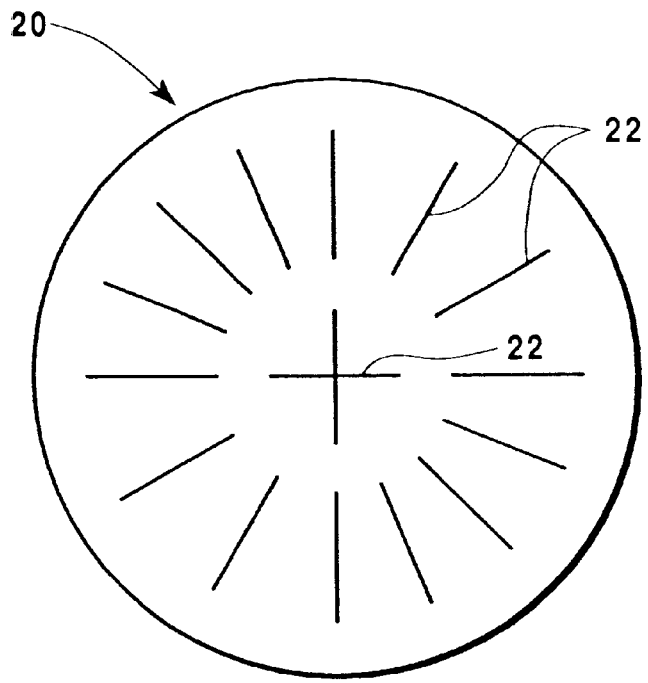
RADIAL LINES OR LINE SEGMENTS
(AREA GREATER AT EDGE)   FIG. 4A
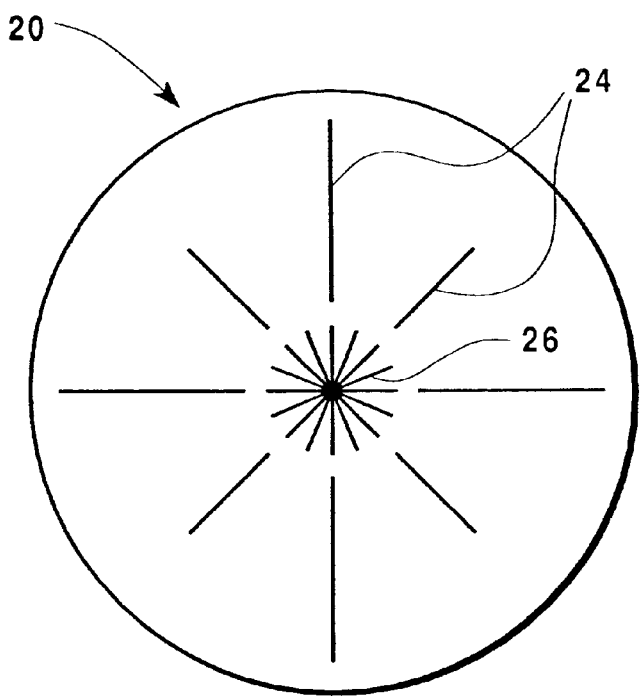
RADIAL LINES OR LINE SEGMENTS
(AREA GREATER AT CENTER)   FIG. 4B

Detail B

See Detail B

SECTION A-A

SPUTTER APPARATUS FOR PRODUCING MULTI-COMPONENT METAL ALLOY FILMS AND METHOD FOR MAKING THE SAME

BACKGROUND OF THE INVENTION

1. Field of the Invention

The present invention relates to an apparatus for sputtering coatings onto substrate deposition surfaces, particularly to sputtering multi-component metal alloy films onto the substrate, such as a copper-magnesium alloy film having high magnesium content. The invention relates specifically to a magnetron sputter target for use in physical vapor deposition of thin films on semiconductor substrates, and a method for making the same.

2. Description of Related Art

Thickness uniformity and structural integrity are increasingly important for sputtered coatings in physical vapor deposition processes. Modern sputtering is typically done with magnetron cathodes. In a magnetron cathode, the target erosion rate is highest where the magnetic field is parallel to the target surface. A disadvantage of planar magnetrons in which the target is essentially a flat surface is that the magnetic field lines must pass uniformly through the entire target. However, typically there remains a central portion that receives little or no sputtering. This makes uniform sputtering of the planar target extremely difficult. Different magnetron sputtering cathode shapes have been employed to eliminate the deficiencies in planar magnetrons. Conical, cylindrical and other sputtering target geometries have been introduced to mitigate many of the detrimental effects of planar target sputtering. In U.S. Pat. No. 6,093,293 issued on Jul. 25, 2000 to Haag, et al., entitled "MAGNETRON SPUTTERING SOURCE," a sputter source having at least two electrically mutually isolated stationary bar-shaped target arrangements mounted one along side the other and separated by respective slits, was introduced as a means for depositing a homogeneous film on a substrate. The electrically mutually isolated stationary targets were designed to eliminate the effects of erosion furrows created by the tunnel-shaped magnet fields applied to the target along specific courses.

Problems arise when different combinations of metal alloys are required for deposition. For example, thin films of copper-magnesium (CuMg) alloys for integrated circuit applications may require magnesium concentrations in excess of approximately 2 atomic percent. Advanced devices calling for ultra-thin liners on the order of less than 200 Angstroms, deposited on dielectric material such as silicon dioxide and the like, will require a higher magnesium content to permit a reliable magnesium oxide (MgO) based diffusion barrier approximately 20 angstroms thick to form at the copper-magnesium/silicon dioxide ($CuMg/SiO_2$) interface. Fabrication of a CuMg alloy target is problematic since the hardness of a CuMg alloy increases greatly when the magnesium concentration exceeds approximately 4 atomic percent. This makes it impractical to fabricate a high magnesium concentration copper-magnesium target, in either a planar or three-dimensional configuration, e.g., a hollow cathode magnetron (HCM) target. Although CuMg alloy targets with magnesium concentrations as high as 4 atomic percent have been developed, the resulting CuMg films deposited on the semiconductor substrates typically contain much less magnesium, on the order of five to ten times less magnesium, than in the targets primarily due to two factors. The first factor concerns the inefficient transport of the sputtered magnesium to the wafer. The sputtered magnesium is predominantly scattered when combined with argon gas during transport. The second factor concerns a low effective sticking coefficient at the growing CuMg film. Thus, in order to obtain bulk magnesium concentrations in the deposited film in excess of two atomic percent under the conditions generally present in prior art techniques, a metal alloy target with a much greater magnesium concentration is required in order to obtain a CuMg film with a high percentage magnesium content.

Another problem with physical vapor deposition (PVD) is the deposition of a conformal film onto high aspect-ratio features that requires a directional, ionized PVD approach. Unfortunately, the ionization probability and transport of copper and magnesium are different so that a uniform alloy target may not be able to provide acceptable global uniformity for both component alloys over the wafer surface. Similar problems exist for other Cu alloy combinations other than CuMg, such as CuAl, CuCo, CuSn, as well as other (non Cu-based) metal alloy systems. Similarly, preparation of ternary alloys such as COWB is equally affected by the aforementioned problems.

In U.S. Pat. No. 6,312,574 issued on Nov. 6, 2001 to Quaderer et al., entitled "TARGET, MAGNETRON SOURCE WITH SAID TARGET AND PROCESS FOR PRODUCING SAID TARGET," a ferromagnetic magnetron target was introduced containing a pattern of blind holes with a circular cross-section distributed along the sputtered surface. The holes were worked into the target plate by drilling. The distribution of the provided blind holes in the target sputtering surface influences the tunnel field in the targeted manner in order to provide a useful sputtering off-rate distribution and a desired erosion profile. Although the shape of the sputtering target is significantly altered by the blind holes for the deposition of ferromagnetic material, there is no compensation through target geometry for distributing a higher content of one metal alloy over another from a target composed of different metals.

In U.S. Pat. No. 6,309,516 issued on Oct. 30, 2001 to McLeod, entitled "METHOD AND APPARATUS FOR METAL ALLOT SPUTTERING," a target comprised of two parallel, elongated segments was positioned immediately adjacent the entrance/exit aperture of the process chamber. Although two separate metals were used as this target, neither metal was inlaid within the other in a geometrical pattern in such a manner as to provide uniform film deposition.

In U.S. Pat. No. 6,206,985 issued on Mar. 27, 2001 to Onishi et al., entitled "Al ALLOY FILMS AND MELTING Al ALLOY SPUTTERING TARGETS FOR DEPOSITING Al ALLOY FILMS," the melting aluminum alloy sputtering target was manufactured through the processes of melting and casting, so that part of the other combined metal, e.g., titanium, Zr, Hf, V, and Nb, is dissolved in a solid solution in the Al matrix, creating a homogeneous metal composition. Neither metal is inlaid within the other in a geometrical pattern designed to provide for or enhance uniform film deposition.

In securing sputter targets to backing plates, bonding materials such as Indium (In) are routinely used. In the construction of metal alloy composite targets, e.g., CuMg alloys, the consideration of eliminating unwanted wicking becomes important since the inlaid metals have more adjoining sections than typically found in homogeneous targets, and thus, more opportunities for the bonding material to wick and eventually become part of the deposited film. For a composite target, it is necessary to avoid wicking of the bonding material between the composite plates since this leads to surface contamination of the target, leading to eventual incorporation onto the chamber and the film. Any implementation of a composite metal alloy target structure must consider and reduce the potential for unwanted wicking.

Bearing in mind the problems and deficiencies of the prior art, it is therefore an object of the present invention to provide a planar target or a hollow cathode magnetron target that allows for a high concentration of alloying elements, thereby providing for high concentration of the alloying elements in the deposited alloy films.

Another object of the present invention is to provide a composite target that can produce an acceptable global uniformity for all the component elements of the target over the wafer surface.

A further object of the invention is to provide a sputter apparatus for producing multi-component metal alloy films with a high concentration of one of the metals from the target metal alloy structure.

It is another object of the present invention to provide a planar target or a hollow cathode magnetron target that allows for a very high magnesium content to produce high-magnesium CuMg films, typically having a magnesium atomic percentage greater than about four.

It is yet another object of the present invention to provide a sputter apparatus in which the areal percent of the target metal alloy can be kept constant or varied from center to edge in a predetermined way to allow ionized physical vapor deposition to produce a film of uniform thickness and stoichiometry on a semiconductor wafer.

A further object of the invention is to provide target fabrication techniques that permit the PVD films to be deposited with high-purity and with repeatable film uniformity and composition during target life.

Still other objects and advantages of the invention will in part be obvious and will in part be apparent from the specification.

SUMMARY OF THE INVENTION

The above and other advantages, which will be apparent to those skilled in art, are achieved in the present invention, which is directed to a sputter target apparatus for a magnetron cathode adapted to allow for a controlled sputtering process and produce a uniform metal alloy film on a semiconductor substrate having a target comprising a top surface, an outer edge, and a plurality of inlays placed within and between sections of the target. The target may be configured for a self-ionized plasma (SIP) deposition application or an ionized metal plasma (IMP) deposition application. The target may further include inlays comprised of pure elements. The target may be planar and may be circularly shaped. The inlays may be wedge-shaped, and may have equal surface areas, or contoured edges wherein the areal density of the wedge-shaped inlays increases non-linearly outwards from the center of the target. The inlays may also comprise wire-shaped or line-segmented configurations. The wire-shaped or line segmented inlays may be configured in a radial pattern extending outwards from the center of the target, and may comprise having a greater density of inlays closer to the center of the target than to an edge of the target. The inlays may also be button-shaped or disc-shaped. The button shaped inlays may be aligned in a circular pattern, such that the average density per unit area of the inlays remains constant as measured from the center to the edge of the target. The sputter target may comprise copper. The target may be configured such that the deposition of the target material and the inlay material leads to the production of alloy films deposited on the wafer, the alloy films comprising CuAl, CuBe, CuB, CuCd, CuCo, CuCr, CuIn, CuPd, CuSn, CuTa, CuTi, CuZr or CuZn. The target may include some inlays comprising pure elements and other inlays comprising metal alloys. The target may also be configured such that the target material and the inlay material leads to the production of alloy films deposited on the wafer, the alloy films including CoW, CoB, CoWB, and ternary alloys.

The inlays and the target sections may further comprise machined step-type patterns at respective adjoining surfaces. The machined tapered edges of the inlays are machined to expose greater surface area of the inlays on the target top surface.

In a second aspect, the present invention is directed to a sputter target apparatus for a magnetron cathode adapted to allow for a controlled sputtering process and produce a uniform metal alloy film on a semiconductor substrate having a target comprising a top surface, an outer edge, and a plurality of inlays comprised of metal alloys placed within and between sections of the target.

In a third aspect, the present invention is directed to a sputter target apparatus for a magnetron cathode adapted to allow for a controlled sputtering process and produce a uniform metal alloy film on a semiconductor substrate having a target comprising a top surface, an outer edge, and a plurality of inlays comprising pure elements and a plurality of inlays comprising metal alloys, placed within and between sections of the target.

In a fourth aspect, the present invention is directed to a method for constructing a planar sputter target apparatus for a magnetron cathode comprising: debonding target backing from the target; forming spaces within the target to accommodate inlays; bonding the backing plate to the target; cleaning the target; and, inserting the inlays within the formed spaces. The method further comprises forming spaces in a predetermined geometric pattern within the target for the inlays.

BRIEF DESCRIPTION OF THE DRAWINGS

The features of the invention believed to be novel and the elements characteristic of the invention are set forth with particularity in the appended claims. The figures are for illustration purposes only and are not drawn to scale.

The invention itself, however, both as to organization and method of operation, may best be understood by reference to the detailed description which follows taken in conjunction with the accompanying drawings in which:

FIG. 4A depicts a radial design pattern of inlaid metal line segments within a planar metal alloy target.

FIG. 4B depicts a radial design pattern of inlaid metal line segments having a dense center construction.

DESCRIPTION OF THE PREFERRED EMBODIMENT(S)

Figure 1:
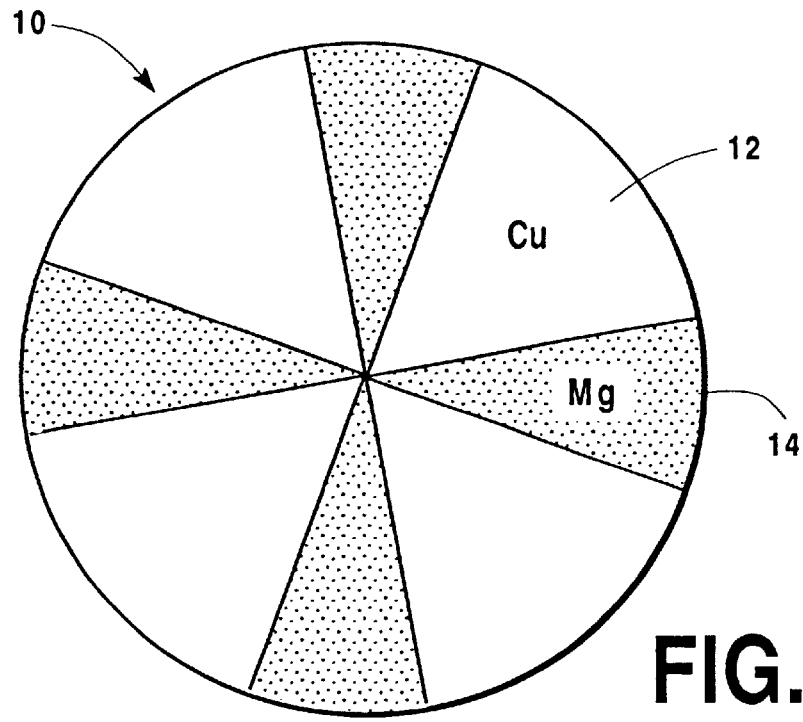
FIG. 1 depicts a planar target having a uniform wedge-shaped inlay pattern with varying copper and magnesium wedges.

In describing the preferred embodiment of the present invention, reference will be made herein to FIGS. 1–9 of the drawings in which like numerals refer to like features of the invention.

A mosaic or inlaid sputter target design is disclosed that is suitable for conventional planar magnetron deposition, RF ionized physical vapor deposition, HCM ionized PVD, ionized metal plasma (IMP) deposition, or self-ionized plasma (SIP) deposition of multi-component alloys for use in integrated circuit (IC) metallization. By way of an example of immediate interest to the IC community, deposition of binary CuMg alloys is disclosed for the preferred embodiment. However, while the invention is described with respect to targets for CuMg films, it can readily be applied to prepare targets for other alloys, including other copper alloys with similar application and benefit to IC processing, such as CuAl, CuBe, CuB, CuCd, CuCo, CuCr, CuIn, CuPd, CuSn, CuTa, CuTi, CuZr and CuZn. Other non-copper binary alloys, such as CoW, CoB, CoWB, as well as ternary alloys may also be employed in a similar fashion.

Copper-magnesium alloys are being explored as self-forming diffusion barriers, adhesion layers, and electroplating seed layers in advanced copper-based interconnect metallization schemes. Thus, the application of these alloy films on semiconductor wafers is becoming increasingly important. The introduction of inlaid elements of the metal alloys within the target allows for a controlled sputtering process, and produces a uniform metal alloy film on the semiconductor substrate. FIGS. 1–5 show inlaid planar designs in which magnesium inlays—wedges, wires, button-inserts, and the like, are kept constant or varied from center to edge in a predetermined way to allow a method such as ionized physical vapor deposition to produce a film of uniform thickness and stoichiometry on a semiconductor wafer. In the preferred embodiment, the inlaid target geometry requires an alternating geometric pattern of magnesium and copper elements. In a three-dimensional hollow cathode magnetron, given the target erosion profile of the HCM source, the magnesium inserts are ideally arranged from top to bottom, parallel to the axis of the HCM, as opposed to ring inserts. In the case of RF ionized PVD using internal RF coils or ribbons, the coils may be made of magnesium or a copper-magnesium alloy such that a combination of sputtering from the coil and sputtering from the target yield the desired copper alloy film on the wafer.

Since the sputtering yield (in atoms sputtered per incident ion) of magnesium is about twice greater than that of copper (as measured at 500 eV Ar$^+$), a composite target design is a more effective use of magnesium than an alloy target in which the relative copper-to-magnesium sputter yield cannot uniformly determine the film stoichiometry. As an illustration of the physics of this sputtering, consider a target alloy of magnesium at four atomic percent, and assume that the transport of copper and magnesium to the wafer is of equal efficiency. The alloy target will produce a copper (magnesium) film with the same atomic percentage of magnesium (4 atomic percent) as in the target. However, if a composite target with an area of 4% magnesium and 96% copper were sputtered, the two-fold difference in elemental sputtering would yield a concentration of magnesium in the film of (2*4%)/(2*4%+1*96%)=7.7%. This is of particular importance whenever the element with the higher sputter yield is expensive. Moreover, environmental concerns often require that the element with the higher sputter yield be limited in concentration in the target. Similar calculations may be made for other copper alloys, such as CuZn or CuAl, and the like, if appropriate values for sputter yield are used. Particularly relevant for ionized PVD, the radial magnesium concentration may be readily varied to take into account variations in CuMg stoichiometry and non-uniformity resulting from differences in ionization and target transport to the wafer.

Figure 2A:
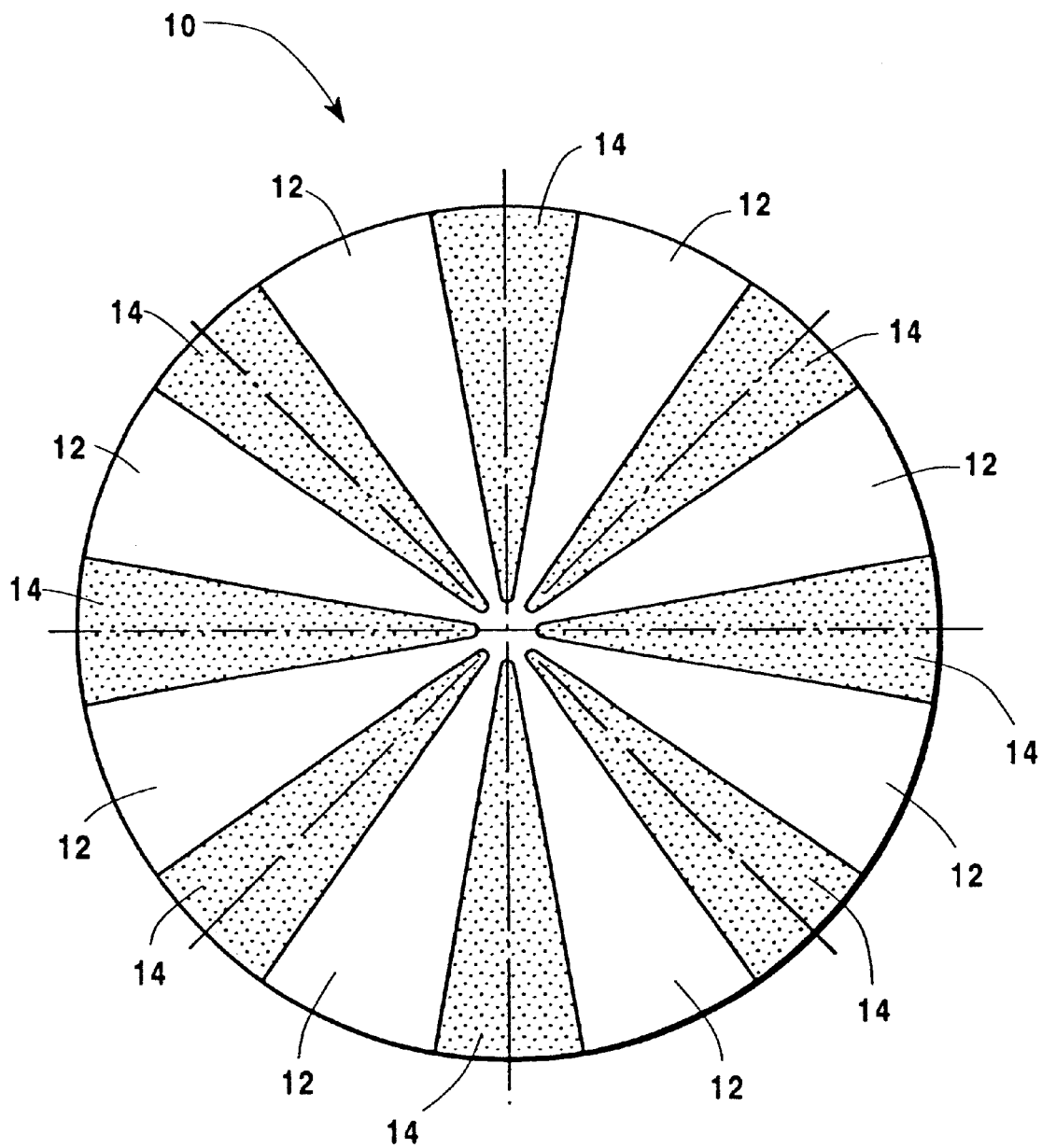
FIG. 2A depicts one embodiment of the wedge-shaped planar target dimensions for a modified CuMg metal alloy target.
Figure 2B:
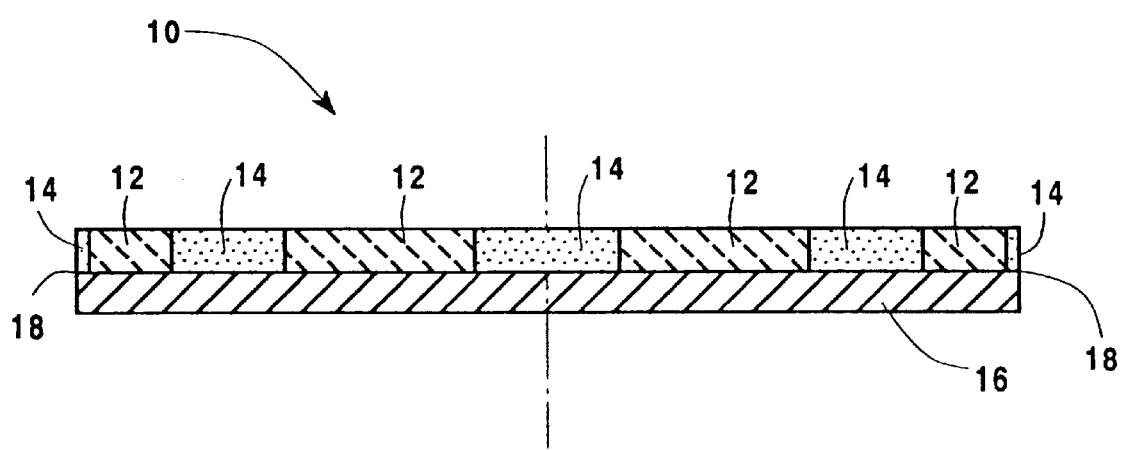
FIG. 2B is a cross-section of the wedge-shaped planar target of FIG. 2A.
Figure 2C:
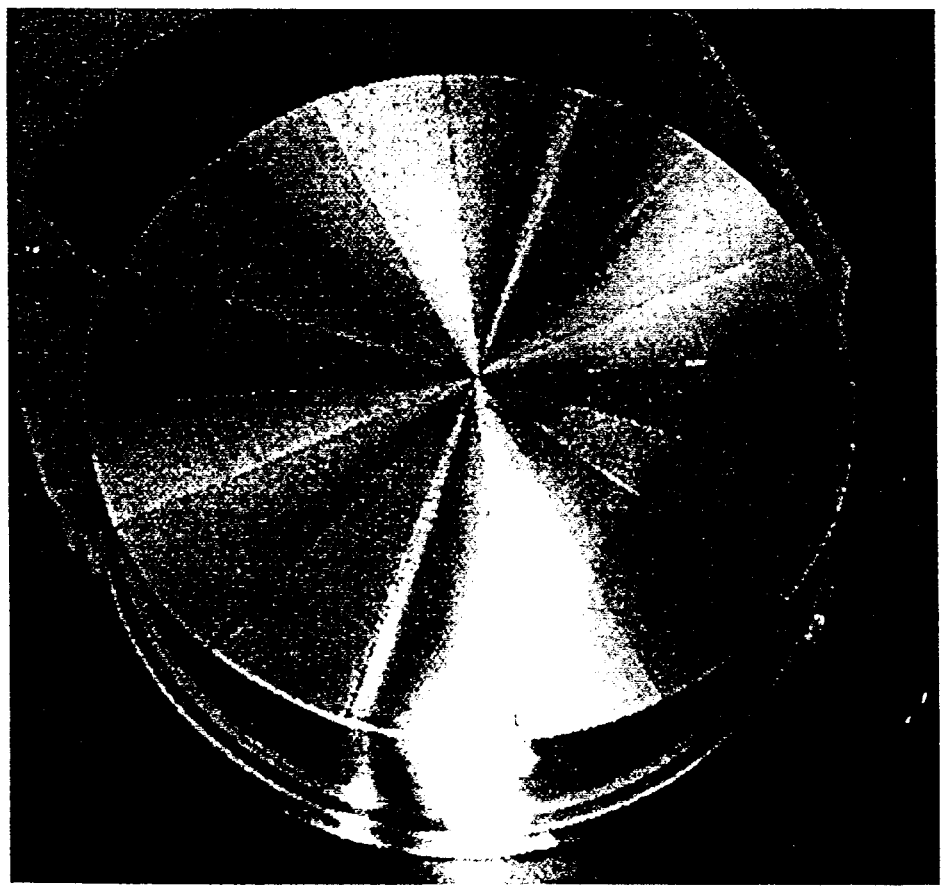
FIG. 2C is a drawing of an actual embodiment of the target depicted in FIG. 2A.

FIG. 1 depicts a uniform wedge-shaped planar target inlay pattern 10 with varying copper 12 and magnesium 14 wedges. The wedges may be equal in exposed surface area, or may vary constructively for a desired film composition. As shown in FIG. 1, the areal density is constant with radius. Although many wedge-shaped dimensions may be considered, FIG. 2A depicts the preferred wedge-shaped planar target dimensions for a modified CuMg metal alloy target. A cross-section of this wedge-shaped design is shown in FIG. 2B, depicted with a backing plate 16 secured by an indium bond 18. FIG. 2C is a drawing of an actual embodiment of the target depicted in FIG. 2A.

Figure 3:
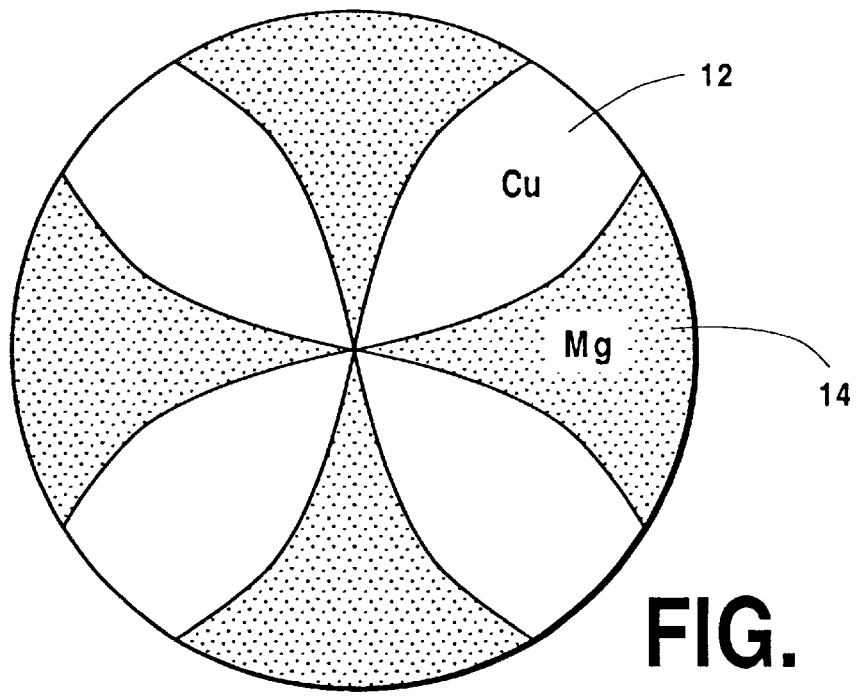
FIG. 3 depicts a wedge-shaped planar target having an areal density of the wedge-shaped composites that increases with radius.

FIG. 3 depicts a wedge-shaped planar target with contoured wedge-shaped inlays. As indicated in FIG. 3, the areal density of these wedge-shaped composites increases non-linearly with radius, unlike the simple wedge-shape construction of FIG. 1. In another embodiment of inlaid metal alloy target design, radial lines or line segments may be introduced in a planar target. FIG. 4A depicts a radial design pattern of a planar target 20 with inlaid metal line segments 22 within a planar metal alloy target. In this embodiment, the area between each line increases as the line segments protrude from the center to the edge. Other radial design patterns may be successfully implemented, for example, where one composite metal has a greater density in the center than at the edge. FIG. 4B depicts a design of composite metal line segments 24 with a dense center construction 26.

Figure 5A:
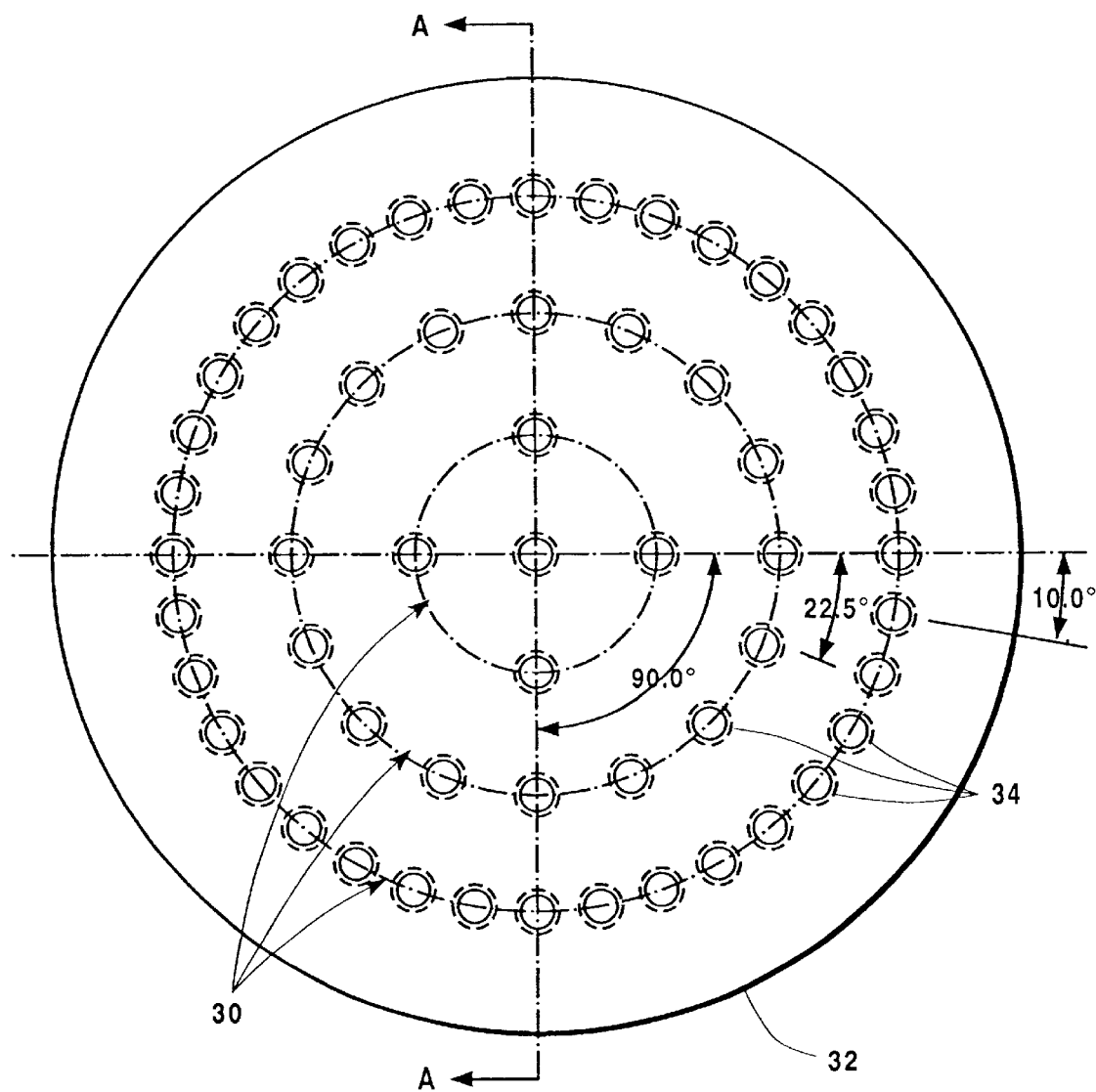
FIG. 5A depicts a button-design of different metal alloys in a planar target assembly.
Figure 5B:
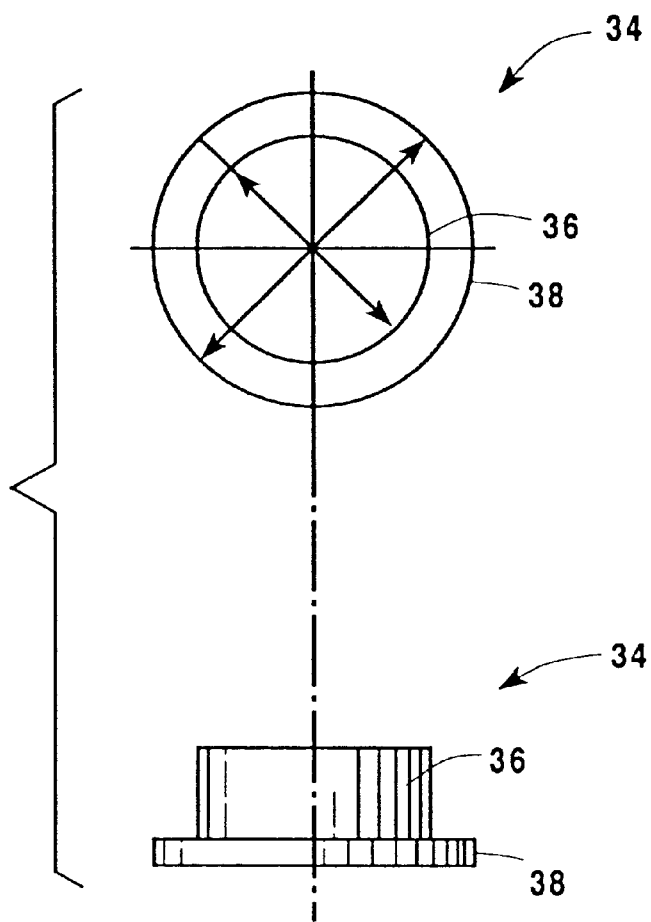
FIG. 5B is a schematic of the buttons of FIG. 5A, shown as one-piece plugs with shaped caps.
Figure 5C:
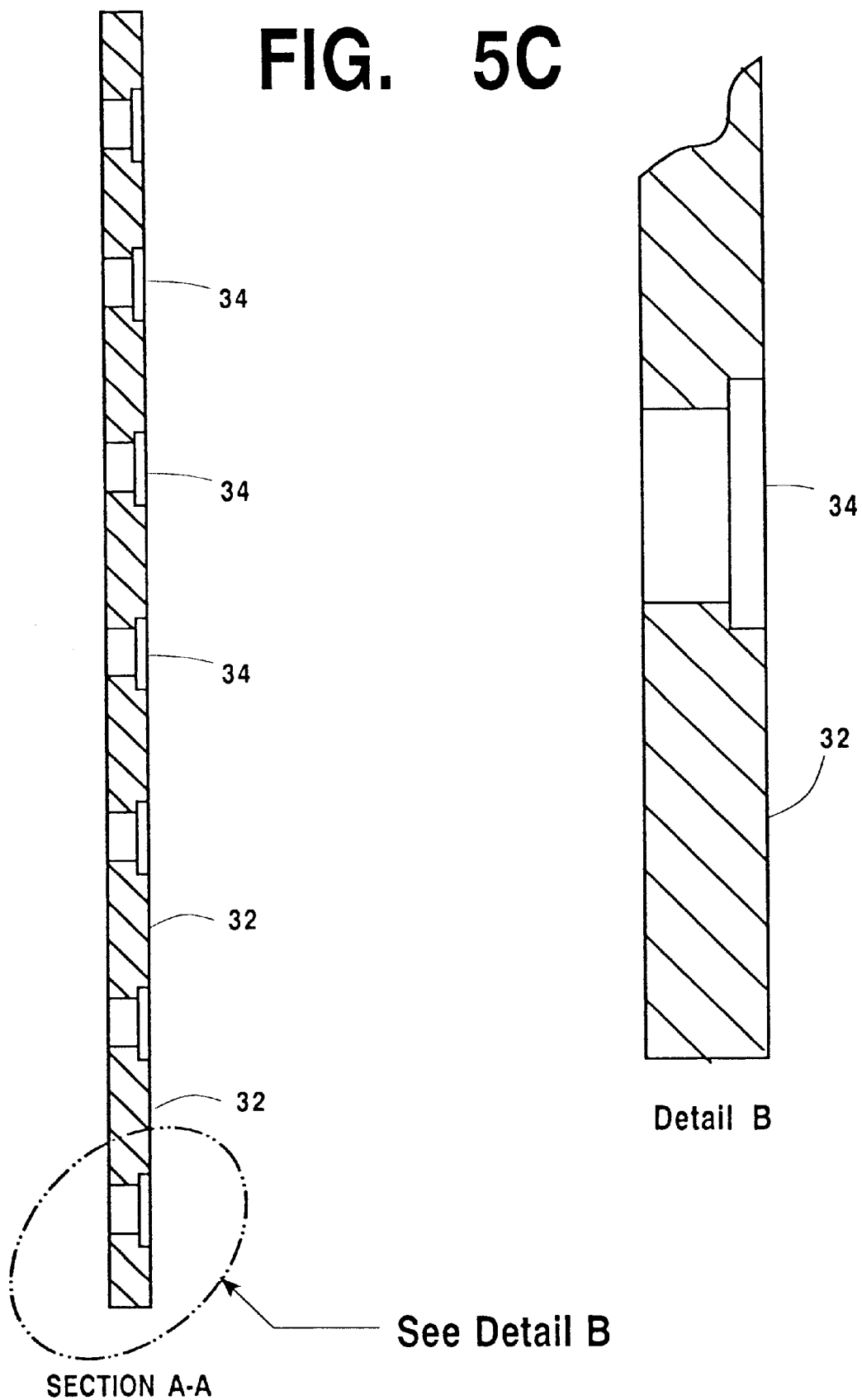
FIG. 5C depicts a cross-sectional view of the inlaid buttons of FIG. 5A within the target assembly.

In yet another embodiment of a planar target design, an inlay of metal plugs or buttons within the target may be employed in various geometric patterns. FIG. 5A depicts a circular button-design pattern 30 of different metal alloys in a planar target assembly 32. The plugs or buttons 34 are inlaid within a copper target assembly in a fashion that yields on an average the same magnesium per unit area as measured from the center to the edge of the target. To construct this design, the copper target is debonded from its backing, and holes for the metal buttons are drilled in a predetermined design pattern. Shown in FIG. 5A, this pattern is one of circular rings about the center, although any number of other button patterns may be employed. Once the buttonholes are produced, a backing plate is indium bonded to the target. The target is then cleaned and readied for insertion of the magnesium (or other metal) inserts. The buttons are depicted in FIG. 5B as one-piece plugs 34 with a body 36 and shaped caps 38. FIG. 5C demonstrates a cross-sectional view of the inlaid buttons 34 within the copper target assembly 32. Care is taken to ensure that there is no visible indium wicking around the sputter side of the magnesium inserts. The final product is then cleaned in any method suitable for PVD sputter target materials and application.

Figure 6:
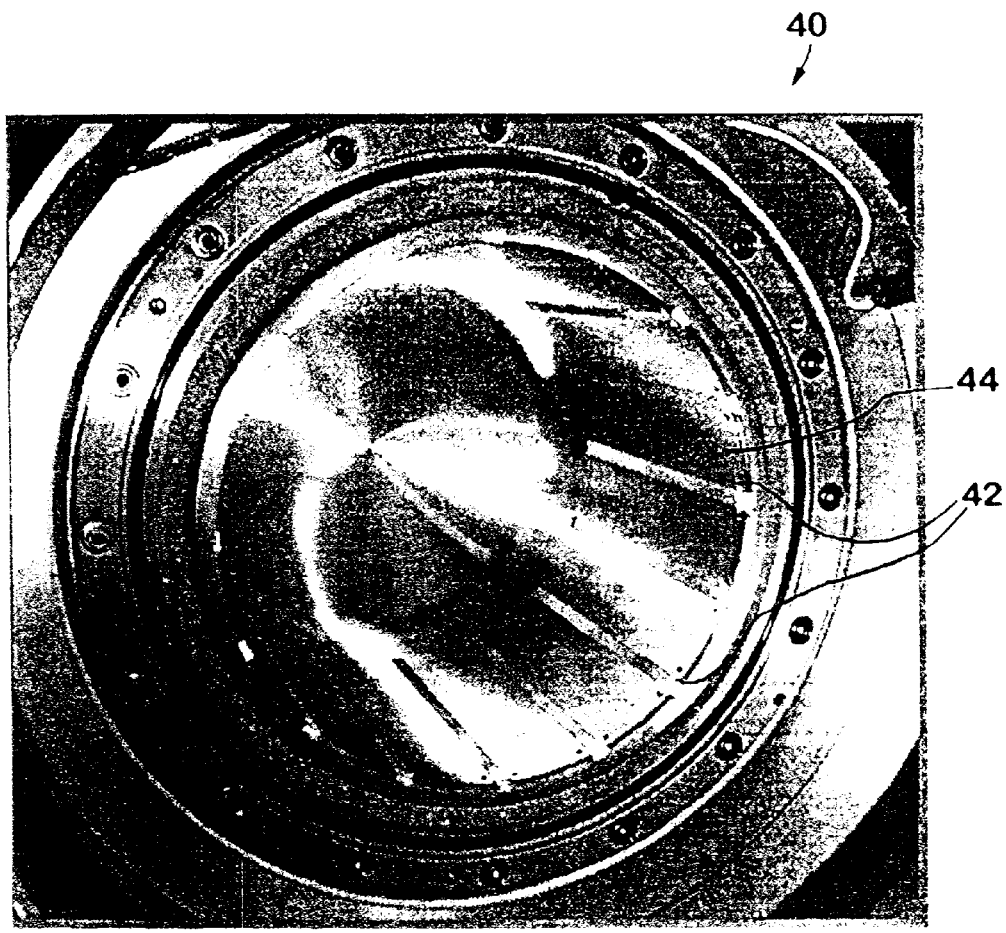
FIG. 6 is drawing of a mosaic target configuration of metal alloys for an HCM configuration.
Figure 7:
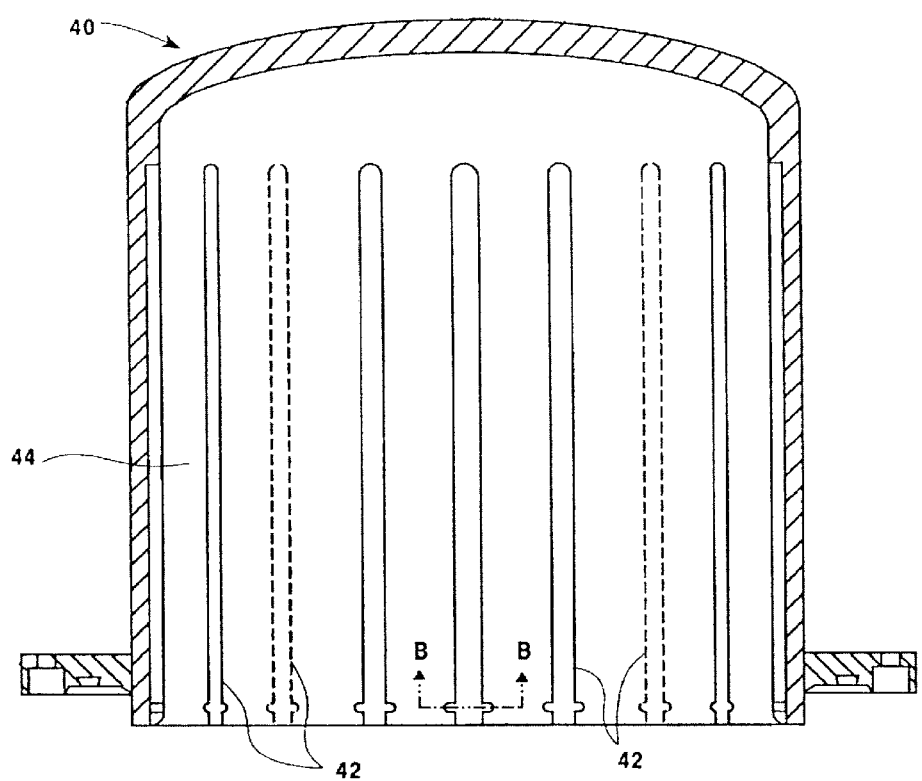
FIG. 7 is a schematic of the HCM inlay design of FIG. 6.

The concept of inlaid composites is also employed for three-dimensional hollow cathode magnetron targets. FIG. 6 is drawing of a mosaic target embodiment 40 of metal alloys for an HCM configuration. Sixteen magnesium strips 42 are inlaid within the hollow copper target 44. A schematic of the HCM inlay design is shown in FIG. 7. In the preferred embodiment, the sixteen magnesium strips 42 may be equally spaced, although other configurations may be readily demonstrated. The magnesium inserts are typically on the order of 99.995% pure.

The inlay designs, both planar and three-dimensional, allow for very high magnesium concentration in the target and hence, in the resultant films as well. Magnesium concentrations much greater than four (4) atomic percent are achievable by these target mosaics. Target configurations having appropriate magnesium-to-copper area ratios may be achieved for any desired film stoichiometry. Particularly relevant for ionized PVD, the radial magnesium a concentration may be varied to take into account variations in CuMg stoichiometry and non-uniformity resulting from differences in ionization and transport to the wafer. The inlay designs are applicable as pure elements as well as metal alloys, or can be any combination thereof. Specifically, three design configurations may be used: a) individual inlays each comprised of pure elements; b) a combination of inlays, some of which are comprised of pure elements while others are comprised of metal alloys; or c) a combination of inlays, some of which are comprised of a particular metal alloy while other inlays are comprised of different metal alloys. Although demonstrated for copper-magnesium targets, the inlay designs are not restricted to any particular combination, and may be successfully employed for other target designs, leading to the production of the following alloy films deposited on the wafer: CuAl, CuBe, CuB, CuCd, CuCo, CuCr, CuIn, CuPd, CuSn, CuTa, CuTi, CuZr and CuZn, and the like. Other non-copper alloys such as CoW, CoB, CoWB, as well as ternary alloys may also be prepared for deposition in a similar fashion.

Figure 8A:
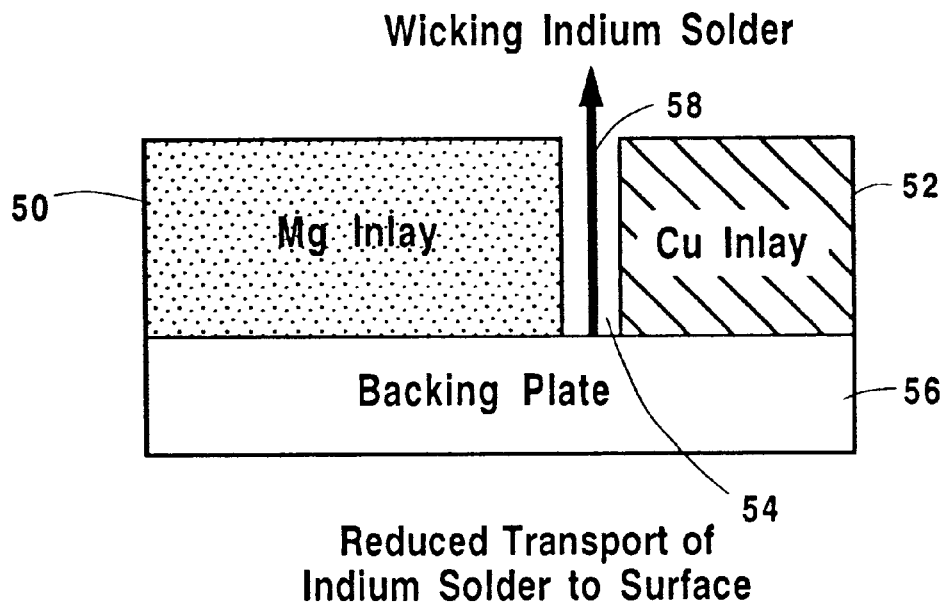
FIG. 8A depicts the wicking resulting from straightedge bonded inlays.
Figure 8B:
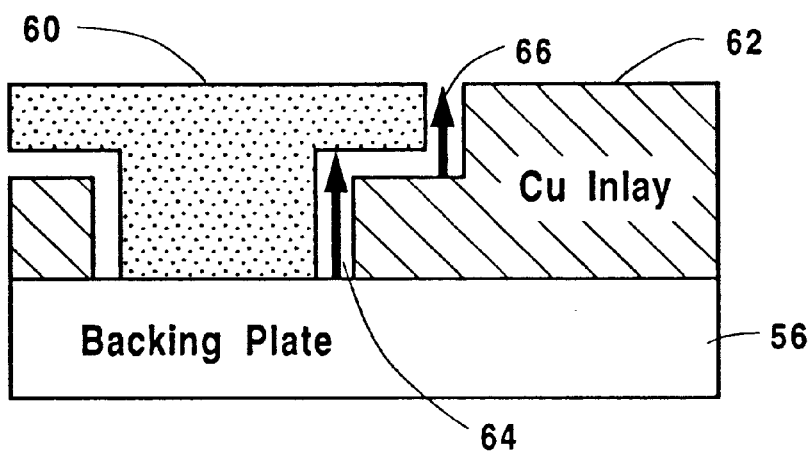
FIG. 8B depicts the reduction of transport of the bonding solder by using a step pattern in the inlay design.
Figure 9A:
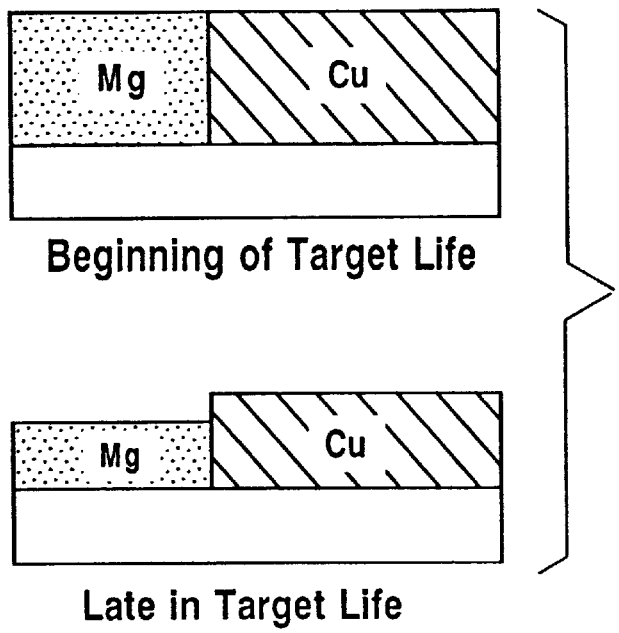
FIG. 9A is a schematic comparing a straightedge target comprising magnesium and copper inlays early and late in target life.
Figure 9B:
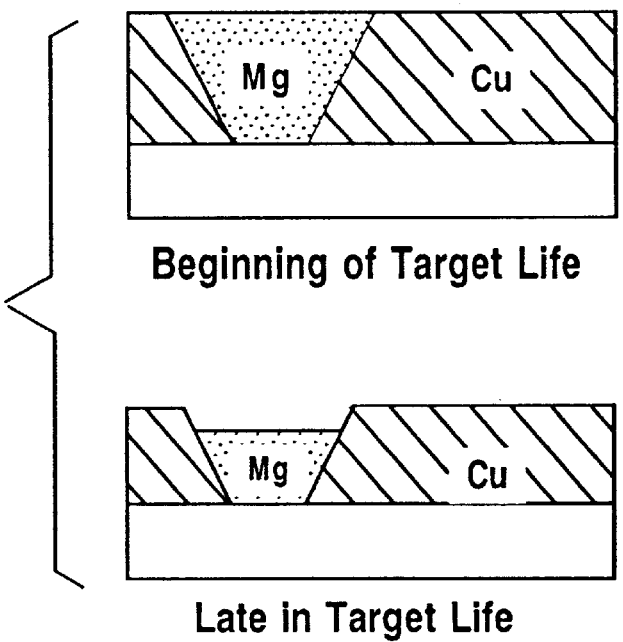
FIG. 9B is a schematic comparing a tapered-edge target comprising magnesium and copper inlays early and late in target life.

The introduction of various composite inlays in sputter target designs creates a number of opportunities for bonding materials to wick to the surface and contaminate the resultant film. To avoid this, an interlocking section approach is employed, in which the copper and magnesium sections are machined in a step-type pattern to minimize the wicking. FIG. 8A demonstrates the wicking resulting from straight-edge bonded inlays. Magnesium inlay 50 is shown adjacent to copper inlay 52 with exaggerated spacing 54 shown there between. Wicking 58 from backing plate 56 is depicted rising through spacing 54. FIG. 8B depicts the reduction of transport of the bonding solder, again shown here as Indium solder (although other solders and backing compositions may be employed), by using a step pattern in the inlay design. The magnesium inlay 60 is t-shaped, with the copper inlay 62 shaped conversely to accommodate a mating intersection. The wicking 64 from the backing plate 56 is blocked from direct transport off the target and reduced to that escaping at the t-shaped intersection 66. A tapered profile will also achieve the benefit of reducing the transport of the wicking material. FIG. 9 compares a straightedge target comprising magnesium and copper inlays to a tapered-edge target of the same inlays. Implementation of a tapered design provides another benefit. Since magnesium sputters faster than copper under normal conditions, a step will develop later in the target's life and cause non-uniformities in film concentration as shown in FIG. 9A. However, by tapering the magnesium so that more magnesium is present early in the target's life, and reduced as the target continues to sputter, the deposition film composition may be made constant throughout the target life. The magnesium still sputters faster than the copper, but is exposed to a smaller surface area as the process continues, as depicted in FIG. 9B.

By introducing inlays of metal alloys to sputter target designs, it is possible to attain higher levels of certain desired metal concentrations in deposition films. Some inlay designs, wedges, wires, line segments, and buttons are disclosed herein, but other inlay designs are not precluded. These inlay designs may be employed for planar geometries and for three-dimensional hollow cathode magnetron targets. The achievement of a more uniform deposition is demonstrated for inlay designs over targets made of uniform metal-alloy compositions. Although the multiple inlays increase the wicking associated with target bonding, a machined step pattern or tapered pattern will reduce the effects of solder transport to the deposition film. Furthermore, a tapered design may be adjusted to achieve a constant deposition of the metal alloys even under conditions of vastly different sputter rates.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A sputter target apparatus for a magnetron cathode adapted to allow for a controlled sputtering process and produce a uniform metal alloy film on a semiconductor substrate having a planar target comprising a top surface, an outer edge, a circular shape, having a center and a radius, and a plurality of wedge-shaped inlays having contoured edges wherein the areal density of said wedge-shaped inlays increases non-linearly outwards from said center of said target, said inlays rising elements in elemental form, and a plurality of inlays comprising metal alloys, placed within and between sections of said target.

2. A sputter target apparatus for a magnetron cathode adapted to allow for a controlled spputtering process and produce a uniform metal alloy film on a semiconductor substrate having a planar target comprising a top surface, an outer edge, and a plurality of shaped or line-segmented inlays comprising elements in elemental form and a plurality of inlays comprising metal alloys, placed within and between sections of said target.

3. The sputter target apparatus of claim 2 further comprising said wire-shaped or line segmented inlays in a radial pattern extending outwards from said center of said target.

4. The sputter target apparatus of claim 3 wherein said wire-shaped or line segmented inlays in said radial pattern further comprise having a greater density of inlays closer to said center of said target than to an edge of said target.

5. A sputter target apparatus for a magnetron cathode adapted to allow for a controlled sputtering process and produce a uniform metal alloy film on semiconductor substrate having a planar target comprising a top surface, an outer edge, and a plurality of button-shaped or disc-shaped inlays comprising elements in elemental form and a plurality of inlays comprising mental alloys, placed within and between sections of said target.

6. The sputter target apparatus of claim 5 further comprising aligning said button-shaped inlaid metal alloy elements in a circular pattern, such that the average density per unit area of said metal alloy elements remains unchanged as measured from said center to said edge of said target.

7. A sputter target apparatus for a magnetron cathode adapted to allow for a controlled sputtering process and produce a uniform metal alloy film on a semiconductor substrate having planar comprising a top surface, an outer edge, and a plurality of inlays comprising elements in elemental form and a plurality of inlays comprising metal alloys, placed within and between sections of said target, wherein said metal alloy inlays comprise a copper based alloy.

8. A sputter target apparatus for a magnetron cathode adapted to allow for a controlled sputtering process and produce a uniform metal alloy film on a semiconductor substrate having a planar target comprising a top surface, an outer edges, and a plurality of inlays is comprising elements in elemental form and a plurality of inlays comprising metal alloys, placed within and between sections of said target, wherein deposition of said target material and said inlay material leads to the production of alloy films deposited on said wafer, said alloy films including CoW, CoB, CoWS, and ternary alloys.

9. A sputter target apparatus for a magnetron cathode adapted to allow for a controlled sputtering process and produce a uniform metal alloy film on a semiconductor substrate having a planar target comprising a top surface, an outer edge, and a plurality of inlays comprising elements in elemental form and a plurality of inlay comprising metal alloys, placed within and between sections of said target, wherein deposition of said target material and said inlay material leads to the production of alloy films deposited on said wafer, said alloy films comprising CuAl, CuBe, CuB, CuCd, CuCo, CuCr, CuIn, CuPd, CuSn, CuTa, CuTi, CuZr or CuZn.

10. A sputter target apparatus for a magnetron cathode adapted to allow for a controlled sputtering process and produce a uniform metal alloy film on a semiconductor substrate, having a target comprising a top surface, an outer edge, circularly shaped, having a center and a radius, and a plurality of wedged shaped inlays having contoured edges wherein said wedge-shaped inlays' areal density increases non-linearly outwards from said center of said target, said wedge-shaped inlays comprised of elements in elemental form placed within and between sections of said target.

11. The sputter target apparatus of claim 10 wherein said target is planar.

12. The sputter target apparatus of claim 10 further comprising wedge-shaped inlays having equal surface areas.

13. The sputter target apparatus of claim 10 wherein said target is configured for a self-ionized plasma (SIP) deposition application.

14. The sputter target apparatus of claim 10 wherein said target is configured for an ionized metal plasma (IMP) deposition application.

15. The sputter target apparatus of claim 10 wherein said target comprises copper.

16. The sputter target apparatus of claim 10 wherein deposition of said target material and said inlay material leads to the production of alloy films deposited on said wafer, said alloy films comprising CuAl, CuBe, CuB, CuCd, CuCo, CuCr, CuIn, CuPd, CuSn, CuTa, CuTi, CuZr or CuZn.

17. The sputter target apparatus of claim 10 further including some inlays comprising elements in elemental form and other inlays comprising metal alloys.

18. The sputter target apparatus of claim 10 wherein deposition of said target material and said inlay material leads to the production of alloy films deposited on said wafer, said alloy films including CoW, CoB, CoWS, and ternary alloys.

19. The sputter target apparatus of claim 10 wherein said inlays and said target sections further comprise machined step-type patterns at respective adjoining surfaces.

20. The sputter target apparatus of claim 19 further comprising said machined tapered edges of said inlays machined to expose greater surface area of said inlays on said target top surface.

21. A sputter target apparatus for a magnetron cathode adapted to allow for a controlled sputtering process and produce a uniform metal alloy film on a semiconductor substrate, having a target comprising a three-dimensional configuration for a hollow cathode magnetron device having a target opening at one end, a top surface, an outer edge, and a plurality of inlays placed within and between sections of said target.

22. The sputter target apparatus of claim 21 further comprising inlays equally distributed within said hollow cathode target.

23. The sputter target apparatus of claim 21 wherein said inlays are elongated strips distributed linearly perpendicularly away from said target opening.

24. The sputter target apparatus of claim 21 wherein said target comprises copper.

25. The sputter target apparatus of claim 21 wherein deposition of said target material and said Inlay material leads to the production of alloy films deposited on said wafer, said alloy films comprising CuAl, CuBe, CuB, CuCd, CuCo, CuCr, CuIn, CuPd, CuSn, CuTa, CuTi, CuZr or CuZn.

26. The sputter target apparatus of claim 21 further including some inlays comprising elements in elemental form and other inlays comprising metal alloys.

27. The sputter target apparatus of claim 21 wherein deposition of said target material and said inlay material leads to the production of alloy films deposited on said wafer, said alloy films including CoW, CoB, CoWB, and ternary alloys.

28. The sputter target apparatus of claim 21 wherein said inlays and said target sections further comprise machined step-type patterns at respective adjoining surfaces.

29. The sputter target apparatus of claim 28 further comprising machined tapered edges of said inlays machined to expose greater surface area of said inlays on said target.

30. A sputter target apparatus for a magnetron cathode adapted to allow for a controlled sputtering process and produce a uniform metal alloy film on a semiconductor substrate having a target comprising a top surface, an outer edge, circularly shaped, having a center and a radius, and a plurality of wedge-shaped inlays comprising metal alloys, placed within and between sections of said target and having contoured edges wherein the areal density of said wedge-shaped inlays increases non-linearly outwards from said center of said target.

31. The sputter target apparatus of claim 30 further including some inlays comprising elements in elemental form and other inlays comprising metal alloys.

32. A sputter target apparatus for a magnetron cathode adapted to allow for a controlled sputtering process and produce a uniform metal alloy film on a semiconductor substrate having a target comprising a top surface, an outer edge, and a plurality of inlays comprised of metal alloys placed within and between sections of said target, such that the deposition of said target material and said inlay material leads to the production of alloy films deposited on said wafer, said alloy films comprising CuAl, CuBe, CuB, CuCd, CuCo, CuCr, CuIn, CuPd, CuSn, CuTa, CuTi, CuZr or CuZn.

33. A sputter target apparatus for a magnetron cathode adapted to allow for a controlled sputtering process and produce a uniform metal alloy film on a semiconductor substrate having a target comprising a top surface, an outer edge, and a plurality of inlays comprised of metal alloys placed within and between sections of said target, such that the deposition of said target material and said inlay material leads to the production of alloy films deposited on said wafer, said alloy films including CoW, CoB, CoWB, and ternary alloys.

34. The sputter target apparatus of claim 33 wherein said target is a three-dimensional configuration for a hollow cathode magnetron device having a target opening at one end.

35. The sputter target apparatus of claim 34 further comprising inlays equally distributed within said hollow cathode target.

36. The sputter target apparatus of claim 33 wherein said inlays are elongated strips distributed linearly perpendicularly away from said target opening.

37. The sputter target apparatus of claim 33 comprising wire-shaped or line-segmented inlays.

38. The sputter target apparatus of claim 37 further comprising said wire-shaped or line segmented inlays in a radial pattern extending outwards from said center of said target.

39. The sputter target apparatus of claim 38 wherein said wire-shaped or line segmented inlays in said radial pattern further comprise having a greater density of inlays closer to said center of said target than to an edge of said target.

40. The sputter target of claim 33 comprising button-shaped or disc-shaped inlays.

41. The sputter target of claim 40 further comprising aligning said button-shaped inlaid metal alloy elements in a circular pattern, such that the average density per unit area of said metal alloy elements remains constant as measured from said center to said edge of said target.

* * * * *

UNITED STATES PATENT AND TRADEMARK OFFICE
CERTIFICATE OF CORRECTION

PATENT NO. : 6,709,557 B1
DATED : March 23, 2004
INVENTOR(S) : Kailasam et al.

It is certified that error appears in the above-identified patent and that said Letters Patent is hereby corrected as shown below:

Column 2,
Line 22, delete "COWB" and substitute therefore -- CoWB --

Column 7,
Line 35, after "magnesium" delete "a"

Column 8,
Line 54, delete "rising" and substitute therefore -- comprising --

Column 9,
Line 11, delete "mental" and substitute therefore -- metal --
Line 34, delete "CoWS" and substitute therefore -- CoWB --
Line 41, delete "inlay" and substitute therefore -- inlays --

Column 10,
Line 15, delete "CoWS" and substitute therefore -- CoWB --

Signed and Sealed this

Thirteenth Day of July, 2004

JON W. DUDAS
*Acting Director of the United States Patent and Trademark Office*